United States Patent [19]
Redington et al.
[11] 3,755,015
[45] Aug. 28, 1973

[54] ANTI-REFLECTION COATING FOR SEMICONDUCTOR DIODE ARRAY TARGETS

[75] Inventors: Rowland W. Redington; S. Morry Blumenfeld, both of Schenectady, N.Y.

[73] Assignee: General Electric Company, Schenectady, N.Y.

[22] Filed: Dec. 10, 1971

[21] Appl. No.: 206,608

[52] U.S. Cl. .................. 148/188, 148/186, 148/187, 148/175, 317/235 R, 29/572, 117/201
[51] Int. Cl. .................. H01l 7/38
[58] Field of Search .................. 148/188, 171, 175, 148/187, 186; 317/235, 27.1 NA; 29/572

[56] References Cited

UNITED STATES PATENTS

| | | | |
|---|---|---|---|
| 3,458,782 | 7/1969 | Buck et al. | 317/235 NA X |
| 3,585,439 | 6/1971 | Schneeberger | 317/235 NA X |
| 3,556,880 | 1/1971 | Heiman et al. | 148/187 X |
| 3,091,555 | 5/1963 | Smythe | 148/188 X |
| 3,481,781 | 12/1969 | Kern | 148/188 X |
| 3,296,040 | 1/1967 | Wigton | 148/175 |
| 3,316,130 | 4/1967 | Dash et al. | 148/175 |
| 3,419,746 | 12/1968 | Crowell et al. | 148/187 X |
| 3,450,581 | 6/1969 | Shortes | 148/187 |
| 3,558,375 | 1/1971 | Engeler | 148/175 |
| 3,615,941 | 10/1971 | Yamada et al. | 148/188 X |
| 3,615,942 | 10/1971 | Blumenfeld et al. | 148/188 X |
| 3,634,150 | 1/1972 | Horn | 148/175 |
| 3,658,584 | 4/1972 | Schmidt | 148/188 X |
| 3,664,895 | 5/1972 | Schaefer et al. | 148/187 |

*Primary Examiner*—G. T. Ozaki
*Attorney*—John F. Ahern et al.

[57] ABSTRACT

A method is described for increasing the minority carrier collection efficiency of a semiconductor camera tube target structure by forming a region of increased conductivity and an anti-reflective coating simultaneously on the light-admitting surface of the target structure. For example, a doped glass is deposited to a quarter wavelength thickness and then heated to diffuse the dopant into the silicon substrate. The resultant is an $n^+$ layer underlying a one quarter wavelength thick $SiO_2$ anti-reflection coating.

6 Claims, 2 Drawing Figures

Patented Aug. 28, 1973 3,755,015

ANTI-REFLECTION COATING FOR SEMICONDUCTOR DIODE ARRAY TARGETS

Figure 1:
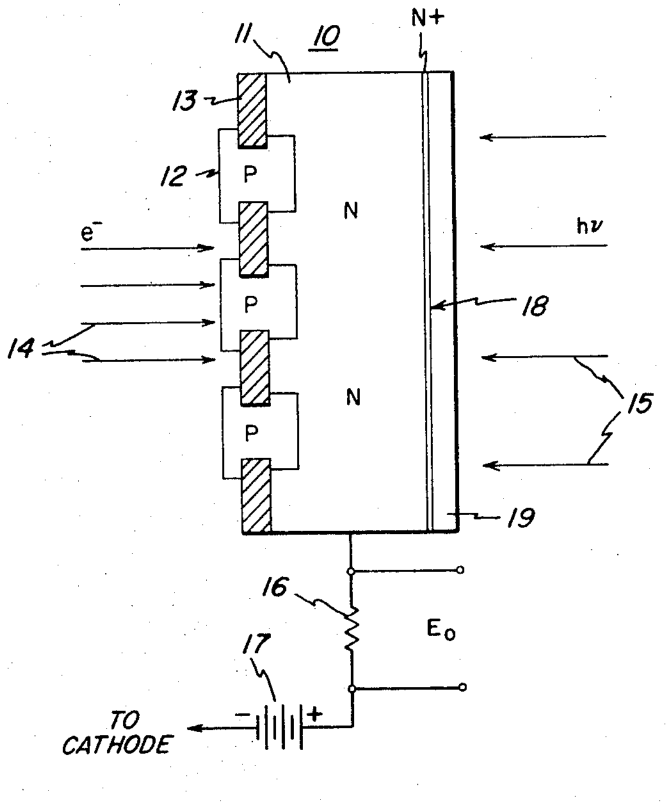

This invention relates to light sensitive storage targets comprising a plurality of semiconductor devices arranged in an array and, in particular, to a method for making same in which fewer processing steps are required than are used in the prior art.

Recently, light sensitive storage devices, such as camera tube targets, have been developed utilizing an array of semiconductor devices, typically diodes, as the transducing mechanism for converting an optical image into an electrical signal. Generally, the diode array is formed by epitaxially growing a plurality of p-type conductivity regions on one surface of an n-type conductivity wafer. This surface is then scanned by an electron beam. The opposite face of the wafer forms the light admitting surface onto which an image is focused.

In operation, a circuit is made comprising an electron beam gun, the target and a current detection circuit connected to the n-type conductivity region of the wafer. The electron beam is scanned across the p-type conductivity regions where the electrons land on the p-type regions, reverse biasing the individual diodes. Photons striking the opposite surface of the target induce electron-hole pairs in the n-type semiconductor. The holes diffuse to nearby diode junctions and are collected, reducing the reverse bias across these diodes. During a subsequent scan, these diodes require more electrons to be restored to their original reverse biased condition, which is detected as an increase in current by a current detection circuit.

Electron-hole pairs are generated by blue photons within a few thousand angstroms of the silicon surface. Because the silicon surface is an area of high recombination, the holes created near that surface have a greater probability of recombination during their random diffusion than do the holes created deeper in the silicon. Thus the quantum efficiency of the target is decreased for light which creates electron-hole pairs near the surface. Further, since the index of refraction of silicon is large, light is reflected at the silicon surface, thereby reducing the number of photons available for electron-hole generation.

Prior art attempts at improving the collection efficiency of the diodes and the quantum efficiency of the target have resulted in the use of at least two additional layers on the image surface of the target. The first is a layer for repelling holes into the bulk and away from the high recombination surface.

This is done by producing a field either by an impurity gradient at the wafer surface or by a transparent, conductive layer on top of a thin insulator layer that is biased positively with respect to the n-type wafer. The second of the additional layers is an anti-reflection coating and typically comprises silicon monoxide, Si0.

Providing these additional layers in accordance with the prior art entails several additional fabrication steps, which further increase cost and handling while reducing the yield of the resulting targets. For example, the $n^+$layer is usually formed by depositing a doped glass, i.e. a glass containing a dopant for the semiconductor, and heating to diffuse the dopant into the semiconductor to modify the conductivity thereof. To deposit the anti-reflection coating, the residue of the doped glass is etched away and then the layer of Si0 is deposited.

In view of the foregoing, it is therefore an object of the present invention to provide a method for making semiconductor targets having increased quantum efficiency.

It is another object of the preset invention to provide a method for producing a hole repelling layer and an anti-reflection layer in as few processing steps as possible.

It is a further object of the present invention to provide a method for producing a hole repelling layer and an anti-reflection coating utilizing a single deposited layer of material.

A further obect of the present invention is to reduce the number of fabrication steps required for producing a semiconductor target having hole repelling and anti-reflection layers.

The foregoing objects are achieved in the present invention wherein, during the fabrication of a semiconductor target, the light admitting surface is coated with a doped glass to a thickness of one quarter of a wavelength at a predetermined point in the spectrum. The target is then heated to diffuse the dopant into the semiconductor, thereby forming an $n^+$layer. The remaining glass then forms an anti-reflection coating since it is one quarter wavelength thick.

A more complete understanding of the present invention can be obtained by considering the following detailed description in conjunction with the accompanying drawings, in which:

FIG. 1 schematically illustrates a camera tube target in accordance with one embodiment of the present invention.

Figure 2:
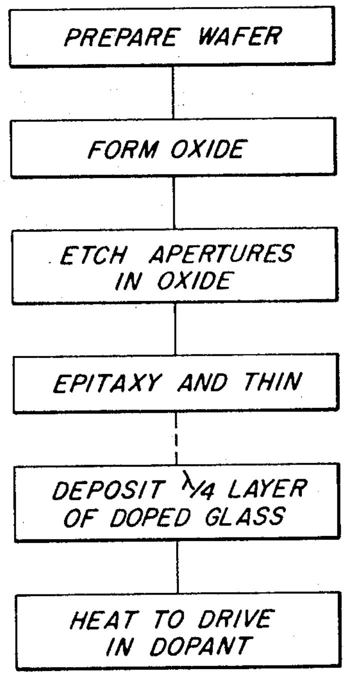

FIG. 2 illustrates the steps followed in carrying out the present invention.

In FIG. 1, camera target 10 generally comprises a wafer of semiconductor material, such as silicon, having first and second major surfaces. The first major surface is scanned by an electron beam and contains the diode array. An optical image is focused on the second major surface upon which coatings are applied for improving the quantum efficiency of the target.

Specifically, camera target 10 comprises an n-type silicon wafer 11 containing p-type cnductivity regions 12 protruding through apertured insulating layer 13.

An electron beam, represented by arrows 14, scans the first major surface of the wafer and reverse biases the plurality of p-n junctions as the electrons land on each p-type conductivity region 12 . When an optical image is incident upon the second major surface of the wafer, photons 15 induce electron-hole pairs in wafer 11. Electron-hole pairs formed near a p-n junction tend to reduce the reverse bias on the p-n junction due to the recombination of the electrons in a p-type conductivity region with the holes from an electron-hole pair. Subsequent scanning of the target by electron beam 14 produces a variable current due to the variable amount of charge necessary to restore the p-n junctions to a reverse-biased condition. This variation in charge is sensed by the variations in voltage drop E. across output resistor 16 which is coupled in a circuit comprising the electron beam apparatus and a source of operating potential 17.

In order to increase the overall efficiency of the target, it is desirable to apply an anti-reflection coating to the light admitting surface of the target so that electron-hole pair inducing photons are not reflected from the target but rather are absorbed in the target to induce the electron-hole pairs.

Further, it is desirable that the minority carriers, holes, in the case of an n-type conductivity wafer, travel through the wafer to the electron beam scanned side of target 10. Thus, the holes will be readily available for discharging of the p-n junctions. In order to carry this out, an enhanced, i.e. increased, conductivity layer 18, is utilized to create a field which drives the holes towards the electron beam scanned side of the target. Overlying the enhanced conductivity layer is an anti-reflection coating 19.

Continuing the above example of an n-type wafer, enhanced conductivity layer 18 comprises an $n^+$layer underlying anit-reflection coating layer 19, which is one quarter wavelength thick at the frequency of radiation at which reflection is to be minimized.

The method in accordance with the present invention whereby layers 18 and 19 are produced from a single deposition is illustrated in FIG. 2. The steps for preparing a typical target in accordance with the prior art are separated by a dashed line from the steps for providing the anti-reflection and $n^+$layers in a single deposition in accord with our invention.

The camera tube target is formed by suitably preparing a wafer, typically n-type silicon. The preparation step, may, for example, comprise suitable shaping, polishing and cleaning. An oxide is then formed on a first major surface of the wafer, this surface becoming the electron beam scanned surface. The oxide may be formed in any suitable fashion, for example, by thermal oxidation of the substrate. A plurality of apertures are then etched in the oxide in the pattern desired for the array of p-n junctions to be formed in the next step.

The p-type conductivity regions are formed by epitaxially growing several microns of p-type silicon on the exposed silicon substrate. The growth is permitted to continue so that the p-type silicon protrudes through the apertures and extends over the insulating layer. The target is then heated to diffuse a portion of the p-type conductivity inducing impurity, e.g. boron, into the n-type substrate. The substrate is then suitably thinned in preparation for the coatings applied to the second major surface. The method for producing diode array targets of this type is more fully described in copending application Ser. No. 60,767 filed Aug. 3, 1970 by W. E. Engeler and assigned to the same assignee as the present invention, the entire disclosure of said copending application incorporated herein by reference thereto.

In accordance with the present invention, in order to simultaneously form the $n^+$ layer and an anti-reflection coating, a doped glass is deposited on the second major surface of the wafer, which surface forms the light admitting surface of the target. The doped glass is deposited to a thickness of one quarter wavelength at a frequency for which minimum reflection is desired. The doped glass layer can be deposited in any suitable fashion, for example, pyrolytically, or by RF sputtering, or by spinning on from a droplet of silicone organic compound. After the doped glass is deposited to one quarter wavelength thickness, the target is then heated to drive the dopant from the glass into the second major surface of the n-type conductivity wafer, thereby forming an enhanced conductivity layer of predetermined thickness. The residue glass forms the anti-reflection layer.

As an example of the method of the present invention carried out utilizing a spun-on layer, the following has been found to produce suitable layers in accordance with the present invention. Three to five drops of a spin-on doped diffusion source, e.g. doped silicon dioxide in a volatile organic solvent (e.g. alcohol) such as available from the Emulsitone Corporation under the trade name of Phosphorosilica Film, havig a concentration of $1\times10^{19}/cm^3$ of phosphorous, are applied to the wafer, which has been reduced to approxiamtely 15 microns thickness. The wafer is then spun at approximately 3,000 revolutions per minute for 60 seconds to spread the 3–5 drops into a film approximately 1,200A in thickness. The wafer is then heated in air at approximately 150°C for 15 minutes to drive off the organic portion of the diffusion source. The wafer is then heated at approximately 900°C for 15 minutes to diffuse the dopant from the doped glass layer into the n-type silicon wafer. This produces a 1,500A. thick $n^+$ layer with a surface resistivity of approximately 400 ohms per square.

The thickness of the deposited glass layer is determined by the wavelength of the radiation at which reflection is to be minimized. Typically, camera tube targets are optimized for blue light, which has a wavelength of approximately 4,800A. Thus, a film 1,200A thick is utilized.

As noted above, the diffusion source layer may also be deposited pyrolytically. For example, by the reaction of silane and phosphine gas, or by bubbling argon through tetraethylorthosilicate and phosphorous oxychloride.

As a specific example of pyrolytic deposition of the diffusion source layer by processing with silane doped with phosphine: a 1,000A thick layer of phosphorous doped $SiO_2$ is deposited using $PH_3$-$SiH_4$ concentrations to produce a concentration of approximately $1\times10^{19}/cm.^3$ of phosphorous in the $SiO_2$. The phosphine flow is turned off and an approximately 200–250A layer of pure silicon dioxide is then deposited. During the deposition of the phosphorous-doped diffusion source layer, the substrate temperature is maintained below 500°C. The wafer is then heated at 900°C for 15 minutes to diffuse the phosphorous from the glass into the n-type conductivity wafer, thereby producing an approximately 1,500A thick $n^+$ layer with a resistivity of approximately 400 ohms per square. The residue glass forms an anti-reflection coating approximately 1,200–1,250A thick thereby optimizing the anti-reflection property in the region of blue light.

Obviously, for the optimization of other wavelengths of light, the anti-reflection coating may be made thicker or thinner. For example, to optimize the anti-reflection property in the near infrared range, the anti-reflection coating would be approximately 2,200–2,500A. thick since the wavelengths are approximately 9,000–10,000A.

Having thus described the invention, it will be apparent to those skilled in the art that various modifications can be made without departing from the spirit and scope of the present invention. For example, as previously noted, the diffusion source film may also be RF sputtered in which case it is then similarly heated to approximately 900°C for about 15 minutes to produce the $n^+$ layer and the anti-reflection layer. For other conductivity type wafers, other useful dopants can be utilized; for example, boron. Further, while illustrated in conjunction with an epitaxially grown diode array target, the present invention can be utilized with other types of targets; for example, a target utilizing diffused diodes.

What we claim as new and desire to secure by Letters Patent of the United States is:

1. A method of making a camera tube target comprising the steps of:

preparing a silicon wafer of a first type conductivity, said wafer having first and second major surfaces;

forming an insulating layer on one major surface of said wafer;

etching a plurality of apertures through said insulating layer;

forming a plurality of regions of second conductivity type through said apertures, depositing a layer of doped glass of approximately one quarter wavelength thick on the other major surface of said wafer, said wavelength corresponding to the received frequency of radiation at which reflection is minimized; and heating said wafer to form a layer in which said first type conductivity is enhanced and an anti-reflection coating from the residue of said doped glass.

2. The method as set forth in claim 1 in which said wafer is n-type silicon and said enhanced conductivity is $n^+$.

3. The method as set forth in claim 2 in which said doped galss comprises phosphorous doped glass.

4. The method as set forth in claim 3 in which said heating is carried out at approximately 900°C for approximately 15 minutes.

5. A method of treating semiconductor camera targets to improve the quantum efficiency thereof comprising the steps of:

depositing a doped glass on the light admitting surface of said target to a thickness of approximately one quarter wavelength at the received frequency of radiation at which reflection is minimized; and heating the target to diffuse the dopant from the glass to the target to form an enhanced conductivity layer for repelling portions of photon induced electron-hole pairs away from said layer.

6. The method as set forth in claim 5 wherein said target comprises n-type conductivity silicon, said dopant comprises phosphorous, said layer comprises $n^+$ silicon, and said heating step comprises:

heating said target to a temperature of about 900°C for approximately 15 minutes.

* * * * *